(12) United States Patent
Horng et al.

(10) Patent No.: US 8,574,936 B2
(45) Date of Patent: Nov. 5, 2013

(54) SEMICONDUCTOR LIGHT EMITTING DEVICE AND METHOD FOR MANUFACTURING THE SAME

(75) Inventors: Ray-Hua Horng, Taipei (TW); Yi-An Lu, Taipei (TW); Heng Liu, Sunnyvale, CA (US)

(73) Assignee: Phostek, Inc., Hsinchu (TW)

( * ) Notice: Subject to any disclaimer, the term of this patent is extended or adjusted under 35 U.S.C. 154(b) by 145 days.

(21) Appl. No.: 13/116,765

(22) Filed: May 26, 2011

(65) Prior Publication Data

US 2012/0168715 A1 Jul. 5, 2012

Related U.S. Application Data

(63) Continuation-in-part of application No. 12/980,964, filed on Dec. 29, 2010, now Pat. No. 8,178,886.

(51) Int. Cl.
*H01L 27/15* (2006.01)
*H01L 33/22* (2010.01)
*H01L 33/06* (2010.01)

(52) U.S. Cl.
USPC .............................................. 438/27; 257/13

(58) Field of Classification Search
CPC ......... H01L 27/15; H01L 33/00; H01L 33/02; H01L 33/06; H01L 33/22; H01L 33/36
USPC ............... 257/13, E33.012, E27.12, E33.074; 438/27

See application file for complete search history.

(56) References Cited

U.S. PATENT DOCUMENTS

2005/0062061 A1* 3/2005 Horng et al. .................. 257/103

* cited by examiner

*Primary Examiner* — Walter H Swanson
(74) *Attorney, Agent, or Firm* — Huffman Law Group, P.C.

(57) ABSTRACT

A method for manufacturing a semiconductor light emitting device includes: (a) providing a temporary substrate; (b) forming a multi-layered LED epitaxial structure, having at least one light emitting unit, on the temporary substrate, wherein a first surface of the light emitting unit contacts the temporary substrate, and the light emitting unit includes a n-type layer, an active region, and a p-type layer; (c) forming a n-electrode on the n-type layer; (d) forming a p-electrode on the p-type layer; (e) bonding a permanent substrate on the light emitting unit, the n-electrode and the p-electrode; (f) removing the temporary substrate to expose the light emitting unit; and (g) etching the exposed light emitting unit, to expose at least one of the n-electrode and the p-electrode.

14 Claims, 12 Drawing Sheets

SEMICONDUCTOR LIGHT EMITTING DEVICE AND METHOD FOR MANUFACTURING THE SAME

CROSS-REFERENCE TO RELATED APPLICATION

This application is a continuation-in-part of application Ser. No. 12/980,964, filed 29 Dec. 2010.

BACKGROUND OF THE INVENTION

1. Field of the Invention

This invention relates to a semiconductor light emitting device and a method for manufacturing the same, more particular to a semiconductor light emitting device with a lateral structure.

2. Description of the Related Art

Referring to FIG. 1, a conventional process for manufacturing a semiconductor light emitting chip 1 with a lateral structure comprises: (a) epitaxially growing an epitaxial layer unit 12 on an epitaxial substrate 11, the epitaxial layer unit 12 being made from a GaN series semiconductor material and including a n-type cladding layer 121 that is in contact with the epitaxial substrate 11, a p-type cladding layer 122, and an active layer 123 disposed between the n-type and p-type cladding layers 121, 122; (b) etching the epitaxial layer unit 12 so as to expose partially the n-type cladding layer 121 and to define a plurality of epitaxial regions 15; (c) forming a first electrode 13 disposed on and in ohmic contact with the exposed n-type cladding layer 121 in each of the epitaxial regions 15, and a second electrode 14 disposed on and in ohmic contact with the p-type cladding layer 122 in each of the epitaxial regions 15; and (d) cutting the epitaxial layer unit 12 and the epitaxial substrate 11 to obtain a plurality of semiconductor light emitting chips 1. The structure of the semiconductor light emitting chip 1 is shown in FIG. 2.

The epitaxial substrate 11 is made from a material on which the GaN series semiconductor material of the epitaxial layer unit 12 is easily grown. An example of the material of the epitaxial substrate 11 is sapphire.

In addition, a transparent conductive layer (not shown), e.g., an indium tin oxide (ITO) layer, may be formed between the second electrode 14 and the p-type cladding layer 122 to improve electric conduction of the chip 1.

When an external voltage is applied to the semiconductor light emitting chip 1, an electric current is generated and flows from the second electrode 14 toward the epitaxial layer unit 12 where the charge carriers, i.e., electrons and holes, are allowed to flow and spread laterally. According to the electroluminescence effect, the electrons are able to recombine with the holes within the active layer 123 of the epitaxial layer unit 12 and emit energy in the form of photons. Therefore, the semiconductor chip 1 is able to emit light from the epitaxial layer unit 12.

The aforesaid manufacturing process of the semiconductor light emitting chip 1 with a lateral structure is relatively simple. However, the epitaxial substrate 11 of the chip 1 has a low thermal conductivity that results in thermal accumulation during operation, thereby reducing the service life of the chip 1.

FIGS. 3 and 4 show a semiconductor light emitting chip 2 with a vertical structure and the manufacturing process thereof. As shown in FIG. 4, after epitaxially growing an epitaxial layer unit 22, which has a n-type cladding layer 221, a p-type cladding layer 222, and an active layer 223, on an epitaxial substrate 21, a permanent substrate 23 is bonded to the epitaxial layer unit 22 oppositely of the epitaxial substrate 21, and the epitaxial substrate 21 is removed. The permanent substrate 23 has a high thermal conductivity and is able to serve as an electrode. Another electrode 24 is subsequently formed on and in ohmic contact with the epitaxial layer 22 oppositely of the permanent substrate 23 at an elevated temperature. A semiconductor light emitting chip 2 with a vertical structure (as shown in FIG. 3) is obtained by cutting the epitaxial layer unit 22 and the permanent substrate 23.

The drawback, i.e., the thermal accumulation, associated with the chip 1 with the lateral structure can be overcome by the chip 2 with the vertical structure by virtue of replacement of the epitaxial substrate 21 having poor thermal dissipation with the permanent substrate 23 with a high thermal conductivity.

However, formation of the electrode 24 on the epitaxial layer 22 under an elevated temperature is conducted after adhesion of the permanent substrate 23 to the epitaxial layer unit 22. The high temperature process may cause deformation or deterioration of the permanent substrate 23 and an adhesive between the epitaxial layer 22 and the permanent substrate 23. Therefore, problems such as warping and electric leakage of the semiconductor light emitting chip 2 may occur.

Moreover, in the chips 1 and 2, the electrodes 14, 24 disposed above the epitaxial layer units 12, 22 may shade the light illuminated from the active layers 123, 223 of the epitaxial layer units 12, 22 and reduce the luminance efficiency of the chips 1 and 2. In addition, in the conventional methods, the chips 1 and 2 are generally packaged individually. A subsequent series or parallel connection of the chips 1 or 2 results in a relatively large size of a light emitting product made from the chips 1, 2 and a complicated design for the circuit.

SUMMARY OF THE INVENTION

Therefore, one object of the present invention is to provide a semiconductor light emitting device and a method for manufacturing the same, that can overcome the aforesaid drawbacks of the prior art.

According to a first aspect of the present invention, a method for manufacturing a semiconductor light emitting device comprises: (a) providing a temporary substrate; (b) forming a multi-layered LED epitaxial structure, having at least one light emitting unit, on the temporary substrate, wherein a first surface of the light emitting unit contacts the temporary substrate, and the light emitting unit comprises a n-type layer, an active region, and a p-type layer; (c) forming a n-electrode on the n-type layer; (d) forming a p-electrode on the p-type layer; (e) bonding a permanent substrate on the light emitting unit, the n-electrode and the p-electrode; (f) removing the temporary substrate to expose the light emitting unit; and (g) etching the exposed light emitting unit, to expose at least one of the n-electrode and the p-electrode. The etching process may expose the whole electrode or a portion of the electrode.

According to a second aspect of the present invention, a semiconductor light emitting device comprises: a permanent substrate; a multi-layered LED epitaxial structure formed on the permanent substrate and having at least one light emitting unit that comprises a n-type layer, an active region, and a p-type layer; a n-electrode coupled to the n-type layer and disposed between the permanent substrate and the light emitting unit; a p-electrode coupled to the p-type layer and disposed between the permanent substrate and the light emitting unit; and at least one opening formed in the light emitting unit to expose at least one of the n-electrode and the p-electrode.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
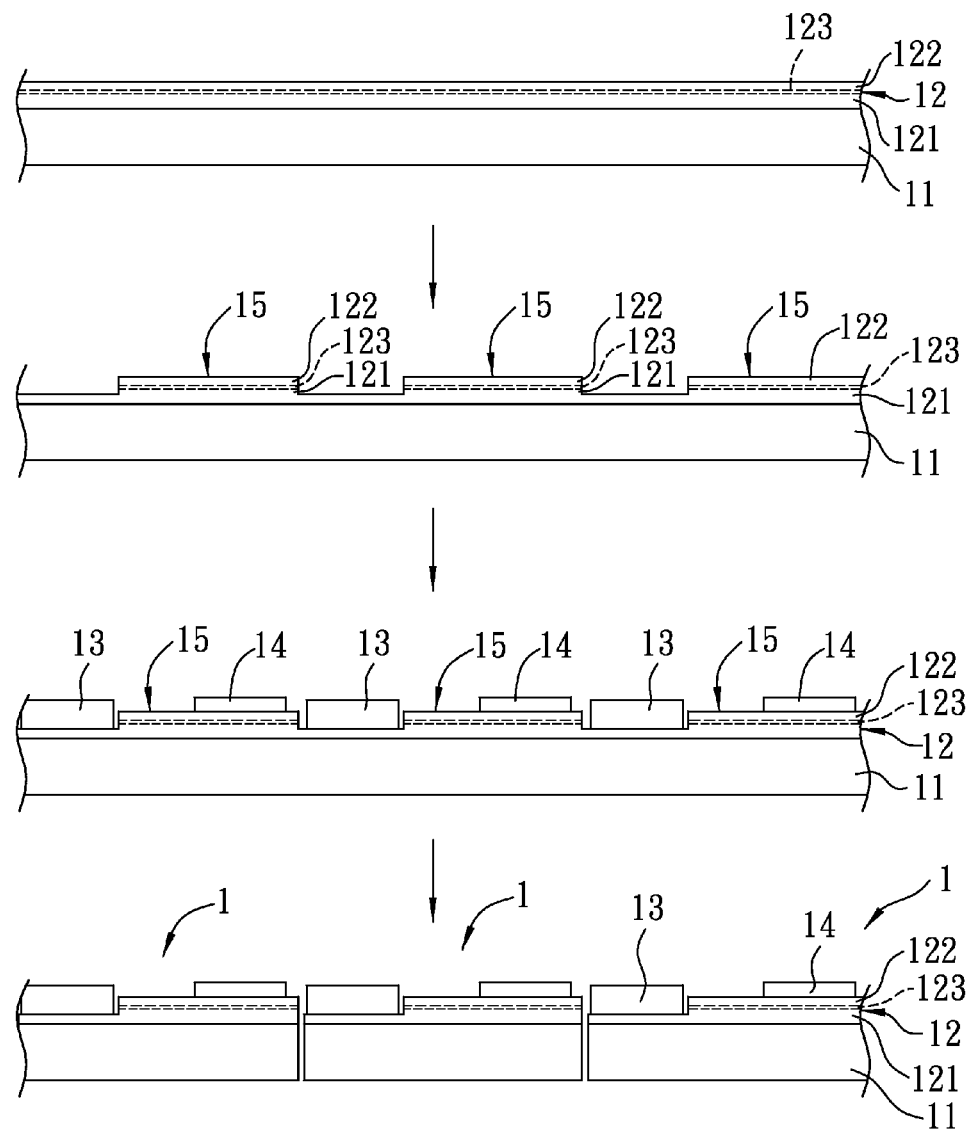
FIG. 1 shows successive steps of a conventional method for manufacturing a semiconductor light emitting chip with a lateral structure.
Figure 2:
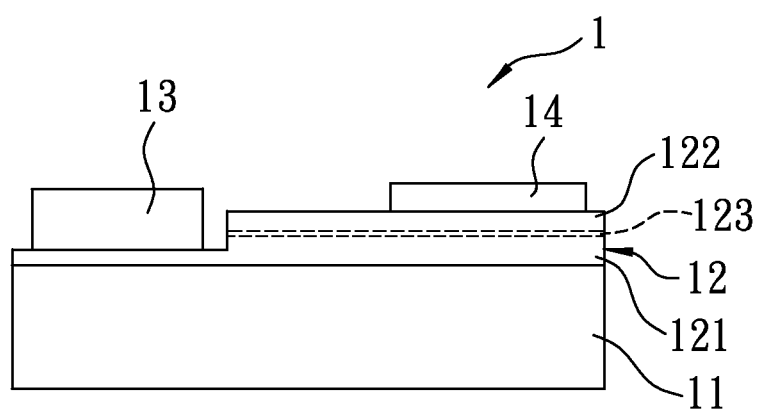
FIG. 2 is a schematic view of a conventional semiconductor light emitting chip made by the method of FIG. 1.
Figure 3:
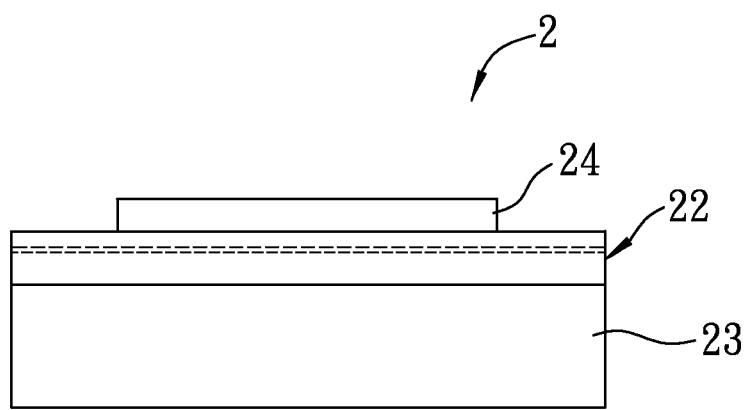
FIG. 3 is a schematic view of a conventional semiconductor light emitting chip with a vertical structure.
Figure 4:
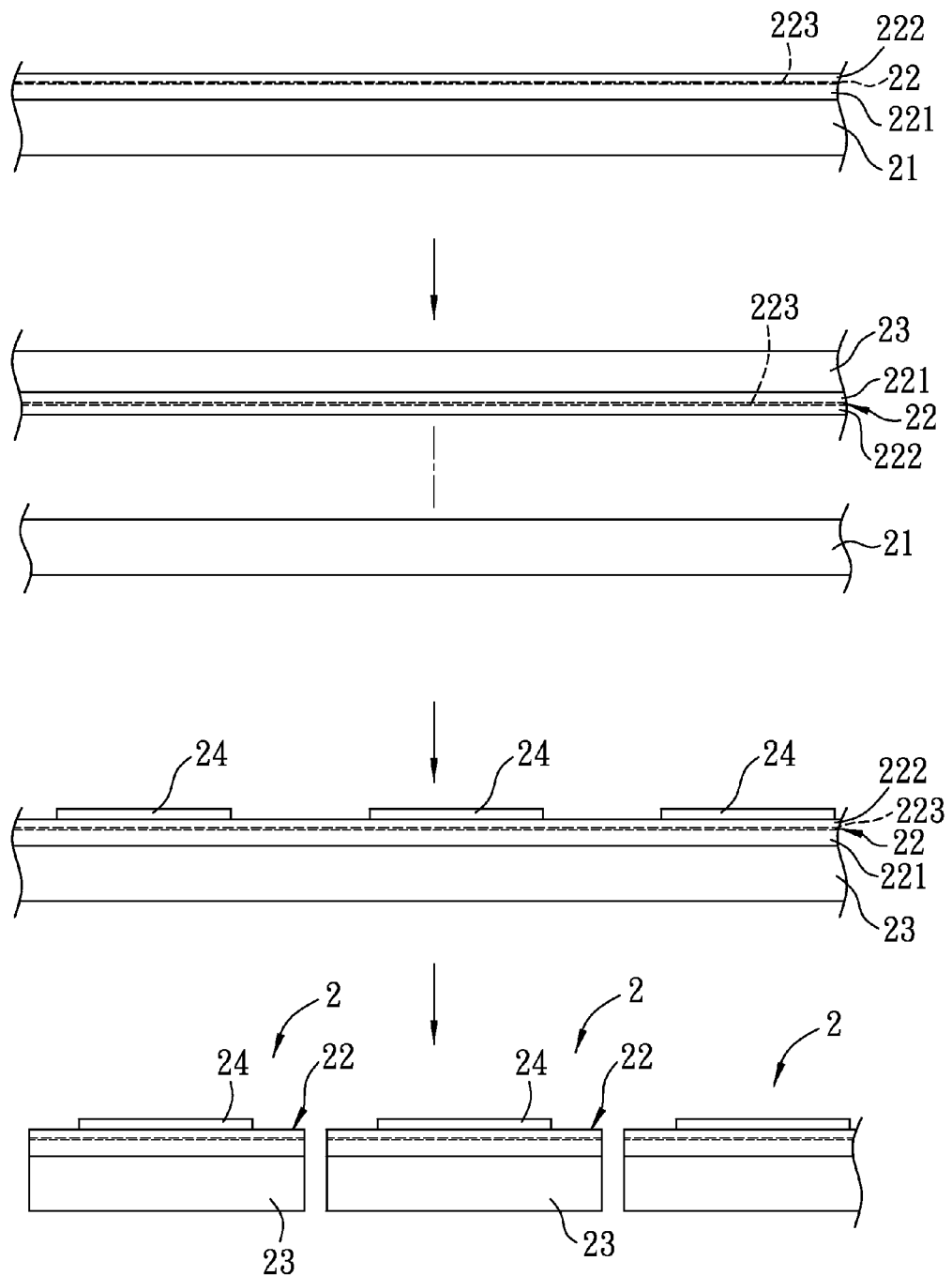
FIG. 4 shows successive steps of a conventional method for manufacturing the semiconductor light emitting device of FIG. 3.

Before the present invention is described in greater detail with reference to the accompanying preferred embodiments, it should be noted herein that like elements are denoted by the same reference numerals throughout the disclosure.

Referring to FIGS. 5 to 8, the first preferred embodiment of a method for manufacturing a semiconductor light emitting device 6 according to the present invention comprises the steps described below.

Figure 5:
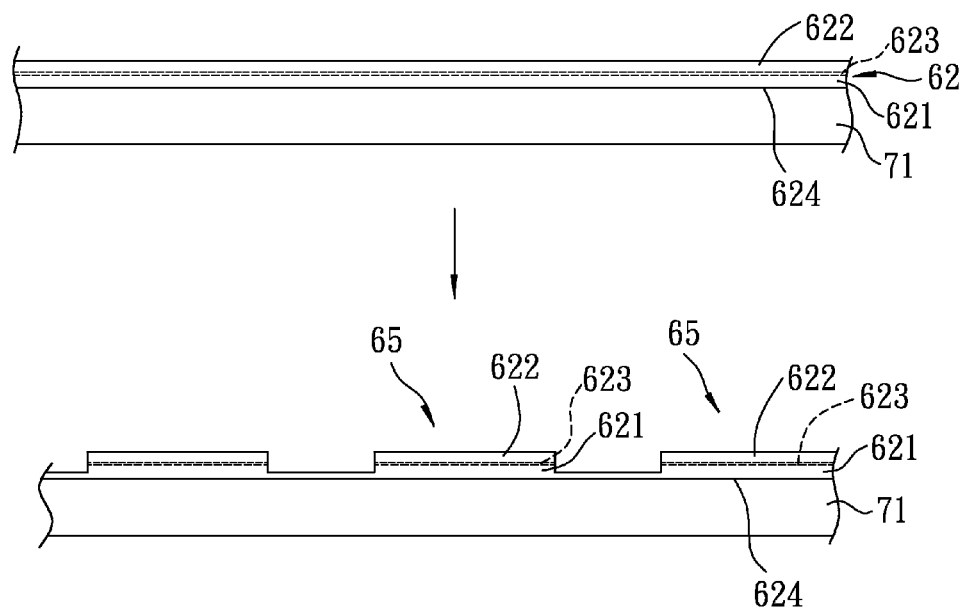
FIG. 5 to FIG. 8 show successive steps of the first preferred embodiment of a method for manufacturing a semiconductor light emitting device according to the present invention.

As shown in FIG. 5, a multi-layered LED epitaxial structure 62 is formed on a temporary substrate 71. The multi-layered LED epitaxial structure 62 has a plurality of light emitting units 65, each of which has a first surface 624 contacting the temporary substrate 71. Each of the light emitting units 65 comprises a n-type layer 621 composed of a n-type semiconductor material, a p-type layer 622 composed of a p-type semiconductor material, and an active region 623 disposed between the n-type and p-type layers 621, 622. In this embodiment, the multi-layered LED epitaxial structure 62 is made of a GaN series semiconductor material, and the temporary substrate 71 is made of sapphire so as to allow the epitaxial growth of a GaN series semiconductor material thereon. The light emitting units 65 are etched so as to expose partially the n-type layers 621. In one example, the n-type layer 621 has the first surface 624 to contact the temporary substrate 71.

In another example, the light emitting units 65 may further comprise a contacting layer, disposed between the n-type layer 621 and the temporary substrate 71, comprising one or any combination selected from the group consisting of an undoped layer, a buffer layer, and a super lattice layer. The contacting layer may have the first surface 624 to contact the temporary substrate 71.

Figure 6:
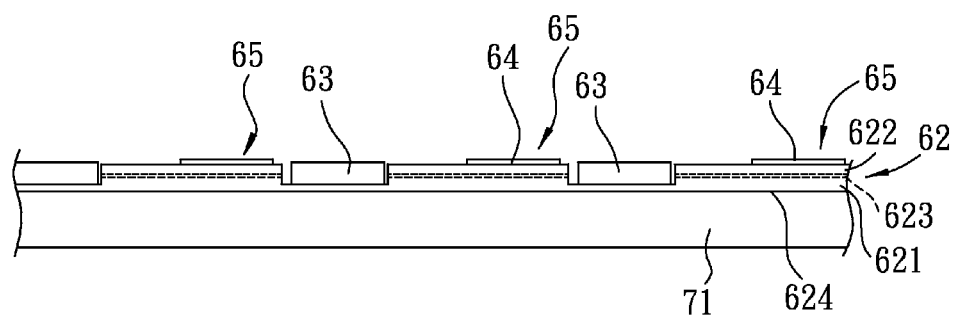

As shown in FIG. 6, in each of the light emitting units 65, a n-electrode 63 is formed on and coupled to the n-type layer 621, and a p-electrode 64 is formed on and coupled to the p-type layer 622.

Figure 7A:
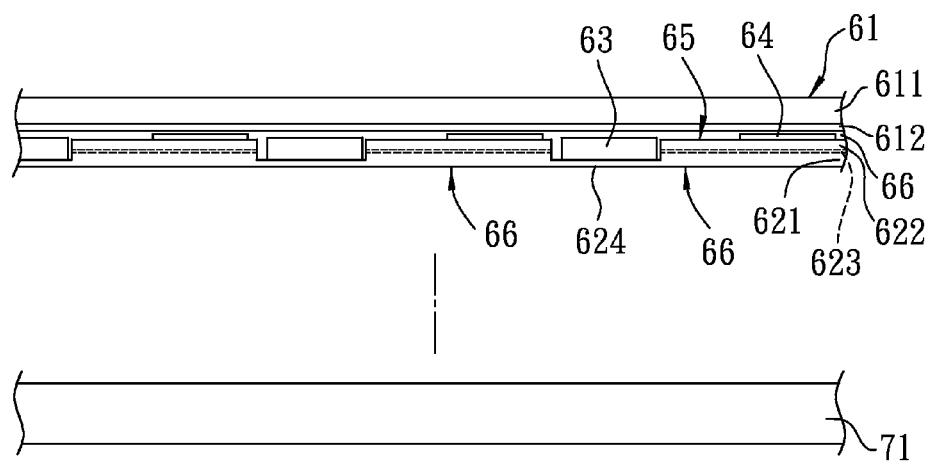

After forming the n-electrodes 63 and the p-electrodes 64, as shown in FIG. 7A, a permanent substrate 61 having a high thermal conductivity is bonded on the light emitting units 65, the n-electrodes 63 and the p-electrodes 64 oppositely of the temporary substrate 71 such that the n-electrodes 63 and the p-electrodes 64 are disposed between the permanent substrate 61 and the light emitting units 65 of the multi-layered LED epitaxial structure 62. The temporary substrate 71 is removed so as to expose the first surfaces 624 of the light emitting units 65.

In this embodiment, the p-type layers 622 of the light emitting units 65 are bonded to the permanent substrate 61. However, other layer elements such as an ITO layer, an oxide layer, an adhesive layer or combinations thereof, may be included in the light emitting units 65 and contact the permanent substrate 61.

In this embodiment, the permanent substrate 61 is adhered to the n-electrodes 63, the p-electrodes 64 and the light emitting units 65 using an adhesive 66. Preferably, the adhesive 66 is an optical adhesive. Alternatively, metal bonding, eutectic bonding, etc., can be used to bond the permanent substrate 61 to the n-electrodes 63 and the p-electrodes 64.

Preferably, the permanent substrate 61 comprises a base 611 made of a material having a high thermal conductivity, and a reflecting layer 612 that is disposed between the base 611 and the adhesive 66 and that is used to reflect the light emitted from the active regions 623 toward the n-type layers 621.

Figure 8:
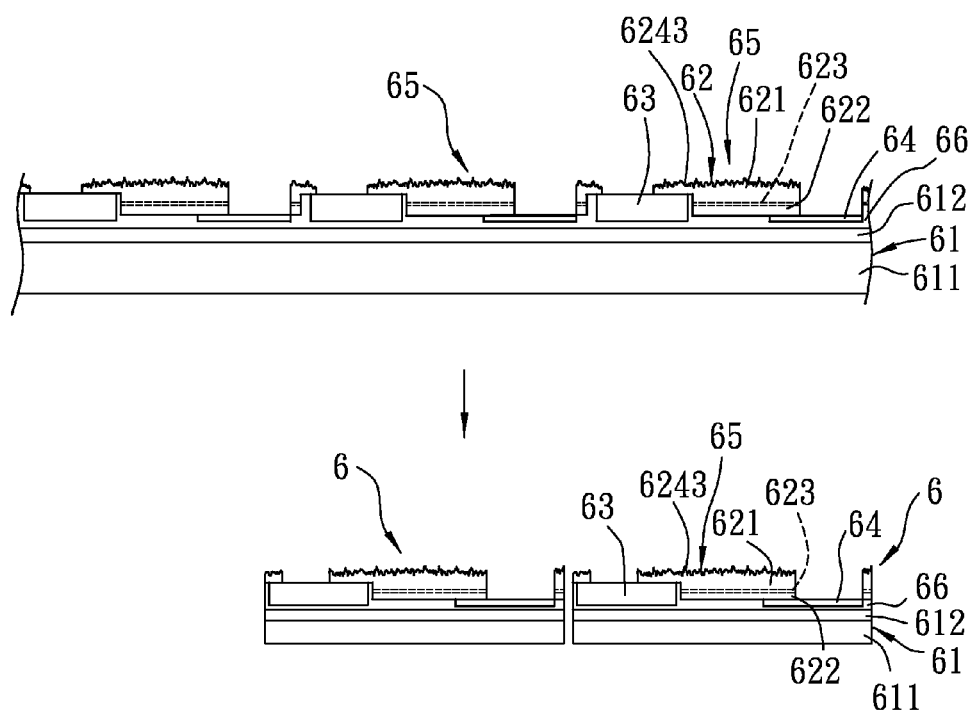

After removing the temporary substrate 71, the exposed light emitting units 65 are etched so as to expose at least one of the n-electrode 63 and the p-electrode 64 of each of the light emitting units 65. The etching process may expose the whole electrode or a portion of the electrode. In the first preferred embodiment, as shown in FIG. 8, the light emitting units 65 are partially etched from the first surfaces 624 so as to expose the n-electrodes 63 and the p-electrodes 64.

The multi-layered LED epitaxial structure 62 and the permanent substrate 61 are subsequently cut to obtain a plurality of individual semiconductor light emitting devices 6.

Figure 7B:
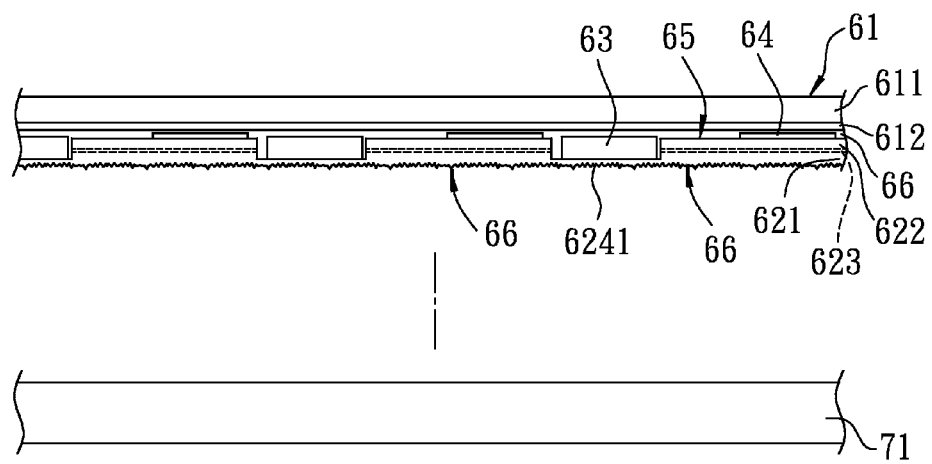
Figure 7C:
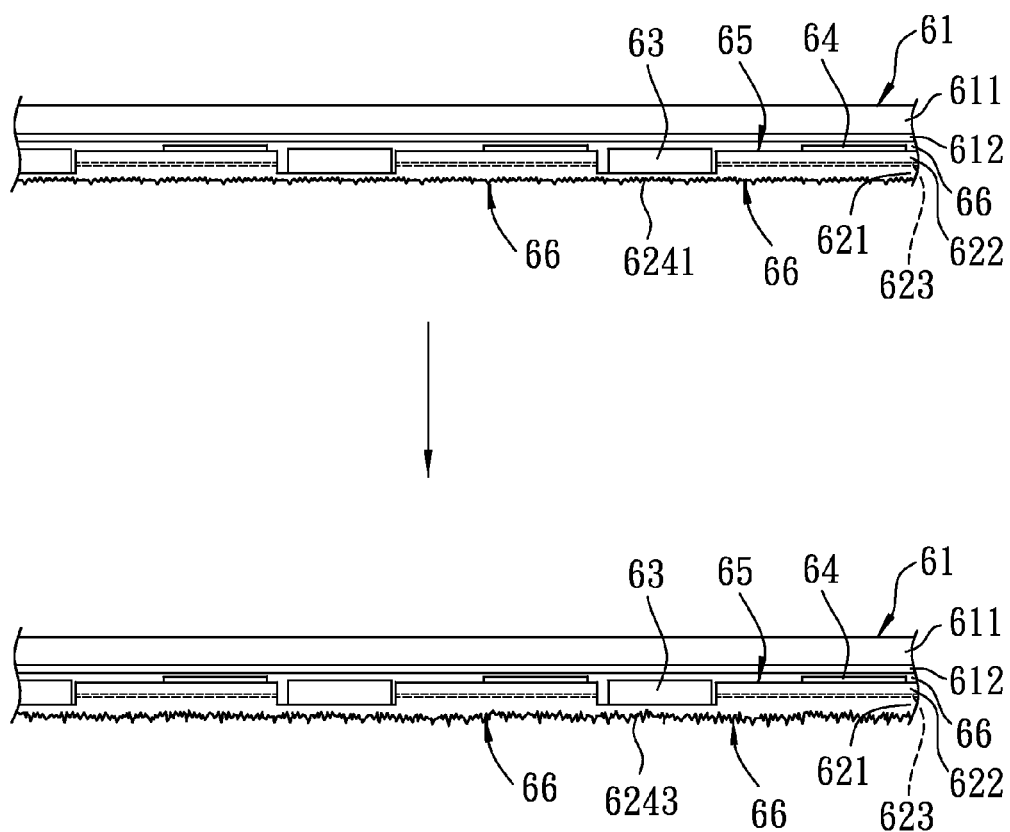

It should be noted that, during removal of the temporary substrate 71, the first surface 624 of each of the light emitting units 65 may be roughened at the same time, so as to form a first roughened surface 6241 exhibiting relatively low roughness (as shown in FIG. 7B). Alternatively, a roughening step can be conducted to roughen the first surfaces 624 of the light emitting units 65 after the temporary substrate 71 is removed, so as to form a second roughened surface 6243 exhibiting relatively high roughness (as shown in FIG. 7C). The roughing step may be performed before the etching step or after the etching step. By roughening the first surfaces 624 of the light emitting units 65, superior light extraction efficiency can be achieved for the semiconductor light emitting device 6.

Figure 9:
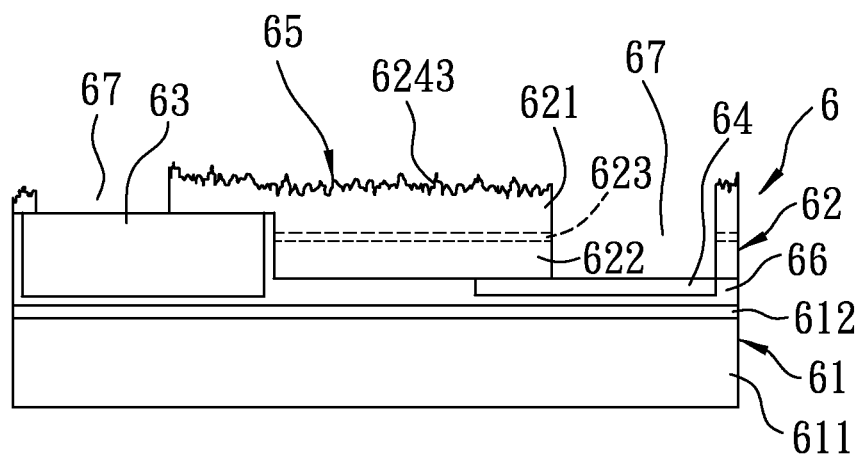
FIG. 9 is a schematic view illustrating a semiconductor light emitting device made by the first preferred embodiment of the method of this invention.

Referring to FIG. 9, a semiconductor light emitting device 6 made by the aforesaid first embodiment of the method according to the present invention comprises: a permanent substrate 61 having a base 611 and a reflecting layer 612; a multi-layered LED epitaxial structure 62 on top of the permanent substrate 61 and having a light emitting unit 65 that comprises a n-type layer 621, an active region 623, and a p-type layer 622; a n-electrode 63 coupled to the n-type layer 621 and disposed between the permanent substrate 61 and the light emitting unit 65; a p-electrode 64 coupled to the p-type layer 622 and disposed between the permanent substrate 61 and the light emitting unit 65; two openings 67 formed in the light emitting unit 65 to expose the n-electrode 63 and the p-electrode 64; and an adhesive 66 used to adhere the light emitting unit 65, the n-electrode 63 and the p-electrode 64 to the permanent substrate 61.

Particularly, the openings 67 are formed away from the permanent substrate 61 by removing partial portions of the light emitting unit 65.

When an external voltage is applied to the semiconductor light emitting device 6 through the n-electrode 63 and the p-electrode 64, the electrons in the light emitting unit 65 release energy in the form of photons resulted from electroluminescence effect, and therefore the semiconductor light emitting device 6 is able to emit light in all directions. During operation, the internal heat generated by the semiconductor device 6 may be dissipated through the base 611, which has a high thermal conductivity, of the permanent substrate 61.

The light from the light emitting unit 65 passes through the n-type layer 621 and is emitted outwardly from the semiconductor light emitting device 6. The second roughened surface 6243 of the n-type layer 621 permits more light to penetrate therethrough. Moreover, since the p-electrode 64 is disposed under the light emitting unit 65 and there is no electrode disposed in the light extracting path, the luminance efficiency of the semiconductor device 6 is improved. In addition, the light emitted from the light emitting unit 65 toward the permanent substrate 61 is reflected by the reflecting layer 612 of the permanent substrate 61, thereby improving light extraction efficiency of the semiconductor device 6.

The second embodiment of the method for manufacturing a semiconductor light emitting device 6 of the present invention has steps the same as those of the first embodiment, except that the second embodiment further comprises the step of forming a plurality of conductive films 88 over the n-electrodes and the p-electrodes of the light emitting units 65. The permanent substrate 61 in the second embodiment further comprises an insulating layer 613 that is disposed on the reflecting layer 612 opposite to the base 611, and that is adhered to the n-electrodes 63 and the p-electrodes 64 of the light emitting units 65 to electrically isolate the n-electrodes 63 from the p-electrodes 64 of the light emitting units 65 (see FIG. 10).

Figure 10:
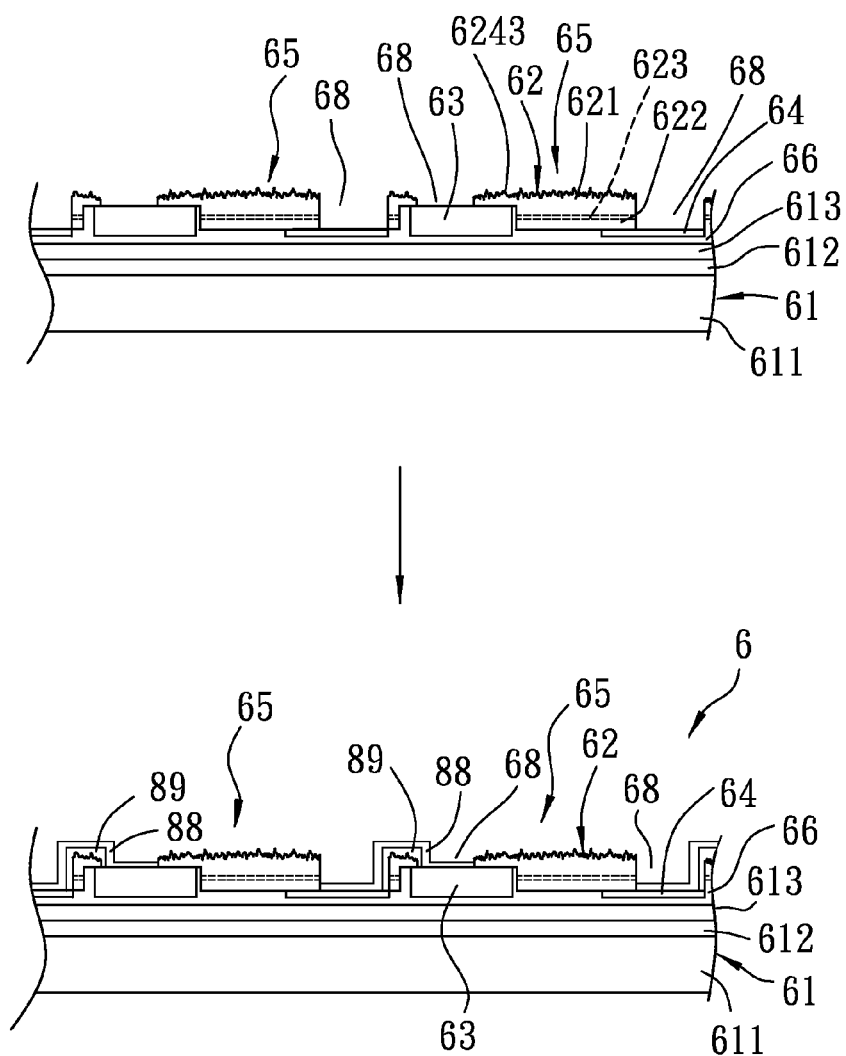
FIG. 10 shows an electrical connection step of the second embodiment of a method for manufacturing a semiconductor light emitting device according to the present invention.

To be specific, after the light emitting units 65 are partially removed to expose the n-electrodes 63 and the p-electrodes 64, the second embodiment of the method according to the present invention further comprises a step of forming a plurality of conductive films 88 over the n-electrodes 63 and the p-electrodes 64 of the light emitting units 65, as shown in FIG. 10. Each of the conductive films 88 electrically connects the n-electrode 63 formed on one of the light emitting units 65 to the p-electrode 64 formed on an adjacent one of the light emitting units 65, i.e., the light emitting units 65 are series connected to each other by the conductive films 88.

Preferably, before forming the conductive films 88, an insulating wall 89 is formed on a predetermined area of the multi-layered LED epitaxial structure 62, which is disposed between the n-electrode 63 formed on one of the light emitting units 65 and the p-electrode 64 formed on an adjacent one of the light emitting units 65. The respective conductive film 88 is to be formed on the respective insulating wall 89. The insulating walls 89 are formed to isolate the respective light emitting units 65 and the conductive films 88.

After forming the conductive films 88, the multi-layered LED epitaxial structure 62 and the permanent substrate 61 are cut to obtain a plurality of semiconductor light emitting devices 6 each including a desired number of the light emitting units 65.

The semiconductor light emitting device 6 made by the second embodiment is shown to include: a permanent substrate 61; a multi-layered LED epitaxial structure 62 formed on the permanent substrate 61 and having a plurality of light emitting units 65; a plurality of n-electrodes 63 each of which is coupled to the n-type layer 621 of the respective light emitting unit 65 and is disposed between the permanent substrate 61 and the respective light emitting unit 65; a plurality of p-electrodes 64 each of which is coupled to the p-type layer 622 of the respective light emitting units 65 and is disposed between the permanent substrate 61 and the respective light emitting units 65; a plurality of openings 68 formed in the light emitting units 65 to partially expose the n-electrodes 63 and the p-electrodes 64 of the light emitting units 65; a plurality of conductive films 88 disposed over the n-electrodes 63 and the p-electrodes 64, each of the conductive films 88 electrically connecting the n-electrode 63 formed on one of the light emitting units 65 to the p-electrode 64 in an adjacent one of the light emitting units 65; and a plurality of insulating walls 89 disposed between the conductive films 88 and the light emitting units 65.

In this embodiment, the permanent substrate 61 has a base 611, a reflecting layer 612 disposed on the base 611, and an insulating layer 613 disposed on the reflecting layer 612 and adhered to the n-electrodes 63 and the p-electrodes 64 of the light emitting units 65 using an adhesive 66 so as to electrically isolate the n-electrodes 63 from the p-electrodes 64.

By forming the conductive films 88 before packaging, the volume of the semiconductor light emitting device 6 made according to the second embodiment can be reduced.

Figure 11:
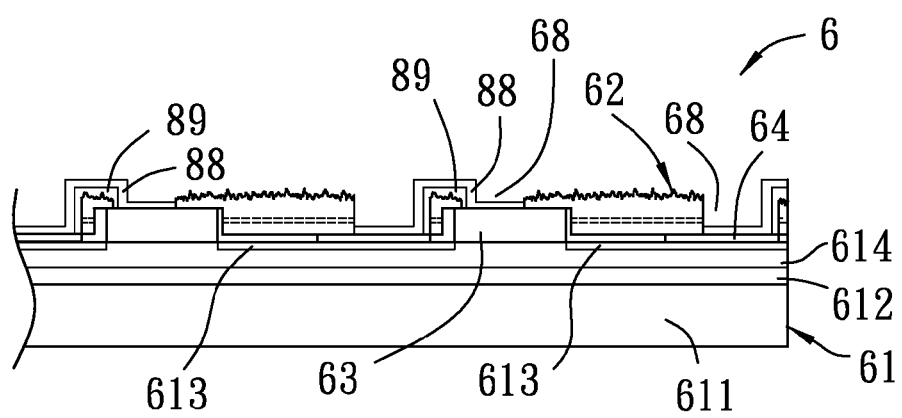
FIG. 11 shows a semiconductor light emitting device which is a modification of the semiconductor light emitting device shown in FIG. 10.

FIG. 11 shows a modification of the semiconductor light emitting device 6 shown in FIG. 10. In this modification, the permanent substrate 61 further comprises a circuit layer 614 that is disposed on the reflecting layer 612 opposite to the base 611 and that is adhered to and electrically interconnects the n-electrodes 63 of the light emitting units 65. The insulating layer 613 is disposed between the circuit layer 614 and the p-electrodes 64 to electrically isolate the n-electrodes 63 from the p-electrodes 64. The adhesive 66 used for adhering the light emitting units 65 to the n-electrodes 63 and the p-electrodes 64 is not shown.

Preferably, the circuit layer 614 is made of a transparent conductive material, and has a predetermined patterned electric circuit thereon.

Figure 12:
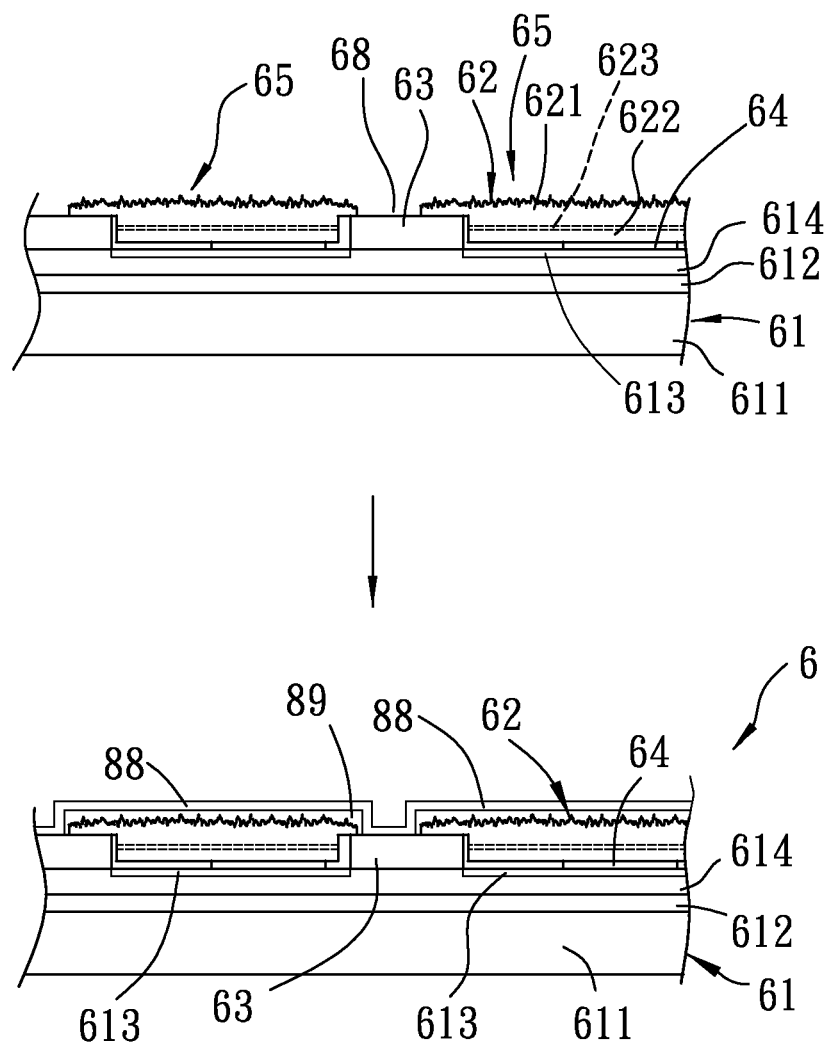
FIG. 12 shows an electrical connection step of the third embodiment of a method for manufacturing a semiconductor light emitting device according to the present invention.

FIG. 12 shows the third embodiment of the method for manufacturing a semiconductor light emitting device 6 of the present invention. The third embodiment differs from the second embodiment in that, the openings 68 are formed in the light emitting units 65 to merely expose the n-electrodes 63, i.e., the p-electrodes 64 are not exposed.

Moreover, in this embodiment, the conductive films are formed over the exposed n-electrodes 63 to electrically connect the n-electrode 63 formed on one of the light emitting units 65 to the n-electrode 63 formed on an adjacent one of the light emitting units 65, i.e., the n-electrodes 63 of each of the light emitting units 65 are parallel connected. The insulating walls 89 are formed between the conductive films 88 and the light emitting units 65. In addition, the permanent substrate 61 has a base 611, a reflecting layer 612 on the base 611, a circuit layer 614 that is disposed on the reflecting layer 612 opposite to the base 611 and that is adhered to and electrically interconnects the n-electrodes 63, and an insulating layer 613 disposed between the circuit layer 614 and the p-electrodes 64 of the light emitting units 65 to electrically isolate the n-electrodes 63 from the p-electrodes 64.

In conclusion, the methods for manufacturing a semiconductor light emitting device 6 with a lateral structure are respectively conducted by bonding a permanent substrate 61 to the multi-layered LED epitaxial structure 62 after forming the n-electrode 63 and the p-electrode 64, thereby eliminating the problems of warping and electric leakage caused by the deformation or deterioration of a substrate and an adhesive of a conventional light emitting chip attributed to the high temperature during forming the electrodes thereof. During operation, the internal heat generated by the device 6 can be dissipated through the base 611 of the permanent substrate 61, thereby resulting in improvement in the stability and the service life of the device 6.

Moreover, the second roughened surface 6243 of the semiconductor device 6 increases the penetration rate of the light emitted from the light emitting unit 65 and thus improves the light extraction and luminance efficiency of the semiconductor light emitting device 6.

In the second and third embodiments, the semiconductor light emitting devices 6 thus manufactured can be electrically connected to each other before packaging. The size of a light emitting product made from the light emitting devices 6 may be reduced accordingly.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for manufacturing a semiconductor light emitting device, comprising the following steps:
   (a) providing a temporary substrate;
   (b) forming a multi-layered LED epitaxial structure, having at least one light emitting unit, on the temporary substrate, wherein a first surface of the at least one light emitting unit contacts the temporary substrate, and the at least one light emitting unit comprises a n-type layer, an active region, and a p-type layer;
   (c) forming a n-electrode on the n-type layer;
   (d) forming a p-electrode on the p-type layer;
   (e) bonding a permanent substrate on the at least one light emitting unit, the n-electrode and the p-electrode;
   (f) removing the temporary substrate to expose the at least one light emitting unit; and
   (g) etching the exposed, at least one light emitting unit, to expose at least one of the n-electrode and the p-electrode.

2. The method of claim 1, wherein the n-type layer has the first surface to contact the temporary substrate.

3. The method of claim 1, wherein the at least one light emitting unit further comprises a contacting layer, disposed between the n-type layer and the temporary substrate, comprising one or any combination selected from the group consisting of an undoped layer, a buffer layer, and a super lattice layer.

4. The method of claim 3, wherein the contacting layer has the first surface to contact the temporary substrate.

5. The method of claim 1, wherein said step of removing the temporary substrate is to expose the first surface of the at least one light emitting unit, and said step of etching the at least one light emitting unit is from the first surface.

6. The method of claim 1, wherein said step of removing the temporary substrate also comprises roughening the at least one light emitting unit, so as to expose a roughened light emitting unit, before the following etching step.

7. The method of claim 1, after said step of removing the temporary substrate, further comprising a roughening step to roughen the at least one light emitting unit, so as to form a roughened light emitting unit, before the following etching step.

8. The method of claim 1, wherein the permanent substrate is bonded on the at least one light emitting unit, the n-electrode and the p-electrode using an adhesive bonding, metallic bonding, or eutectic bonding technique.

9. The method of claim 8, wherein the permanent substrate comprises a base and a reflecting layer.

10. The method of claim 8, wherein the multi-layered LED epitaxial structure comprises a plurality of light emitting units.

11. The method of claim 10, wherein the permanent substrate comprises a base, a reflecting layer, and an insulating layer disposed on the reflecting layer opposite to the base and adhered to n-electrodes and p-electrodes of the light emitting units to electrically isolate the n-electrodes from the p-electrodes.

12. The method of claim 11, further comprising forming a plurality of conductive films over the n-electrodes and the p-electrodes of the light emitting units after step (g), each of the conductive films electrically connecting the n-electrode formed on one of the light emitting units to the p-electrode formed on an adjacent one of the light emitting units.

13. The method of claim 10, wherein the permanent substrate comprises a base, a reflecting layer disposed on the base, a circuit layer that is disposed on the reflecting layer opposite to the base and that is adhered to and electrically interconnects n-electrodes of the light emitting units, and an insulating layer disposed between the circuit layer and p-electrodes of the light emitting units to electrically isolate the n-electrodes from the p-electrodes of the light emitting units.

14. The method of claim 13, further comprising forming a plurality of conductive films over the n-electrodes and the p-electrodes after step (g), each of the conductive films electrically connecting the n-electrode formed on one of the light emitting units to the p-electrode formed on an adjacent one of the light emitting units.

* * * * *